United States Patent [19]

Gärtner et al.

[11] Patent Number: 4,947,790
[45] Date of Patent: Aug. 14, 1990

[54] ARRANGEMENT FOR PRODUCING A GAS FLOW WHICH IS ENRICHED WITH THE VAPOR OF A LOW-VOLATILE SUBSTANCE

[75] Inventors: Georg Gärtner, Aachen; Peter Janiel, Würselen; Hans Rau, Aachen, all of Fed. Rep. of Germany

[73] Assignee: U.S. Philips Corporation, New York, N.Y.

[21] Appl. No.: 295,716

[22] Filed: Jan. 10, 1989

[30] Foreign Application Priority Data

Jan. 16, 1988 [DE] Fed. Rep. of Germany ....... 3801147

[51] Int. Cl.$^5$ ............................................. C23C 16/00
[52] U.S. Cl. ................................... 118/715; 118/724; 118/726; 427/252
[58] Field of Search ............... 34/10, 57 A, 57 B, 165, 34/174; 118/715, 716, 724, 726; 422/244; 427/212, 252; 128/200.14, 203.12, 203.13, 203.15, 204.13, 204.17; 219/271, 273, 274, 276

[56] References Cited

U.S. PATENT DOCUMENTS

| 2,704,727 | 3/1955 | Pawlyk ............................ 427/252 |
| 2,738,762 | 3/1956 | Pawlyk ............................ 427/252 |
| 2,749,255 | 6/1956 | Nack et al. ....................... 427/252 |
| 3,889,388 | 6/1975 | Oguri et al. ......................... 34/10 |

FOREIGN PATENT DOCUMENTS

| 1213698 | 3/1966 | Fed. Rep. of Germany ...... 427/252 |
| 1221520 | 7/1966 | Fed. Rep. of Germany ...... 118/726 |
| 3136895 | 3/1983 | Fed. Rep. of Germany ...... 118/726 |
| 885157 | 12/1961 | United Kingdom ............... 427/252 |

OTHER PUBLICATIONS

Peters, Max S. and Klaus D. Timmerhaus, Plant Design and Economics for Chemical Engineers, Third Ed., (McGraw-Hill, 1980), p. 749.

*Primary Examiner*—Richard Bueker
*Assistant Examiner*—Terry J. Owens
*Attorney, Agent, or Firm*—Norman N. Spain

[57] ABSTRACT

An arrangement for producing a gas flow which is enriched with the vapor of a low-volatile material. The arrangement comprises a vessel (1) having an interior space (12) for holding a powder bed (13), which consists of a low-volatile material and an additional solid inert component. The vessel is arranged in a thermostatically controlled bath (2). A gas flow (4, 16) consisting of an inert gas flows through the arrangement, preferably in the direction of the gravitational force. The gas flow passes, in this sequence, through a thick gas inlet plate (10), the powder bed (13) and a thin gas outlet plate (14). By proper dimensioning the component parts of the arrangement and providing a low pressure in the arrangement a high mass flow of the low-volatile material with a flow constant of a long duration is achieved. The enriched gas flow is conducted, for example, to a low-pressure CVD reactor.

16 Claims, 2 Drawing Sheets

ARRANGEMENT FOR PRODUCING A GAS FLOW WHICH IS ENRICHED WITH THE VAPOR OF A LOW-VOLATILE SUBSTANCE

BACKGROUND OF THE INVENTION

The invention relates to a heatable arrangement for producing a gas flow of an inert gas which is enriched with the vapour of at least one low-volatile, pulverulent substance, the arrangement
 comprising a vessel having an interior space for holding a powder,
 a feed pipe for introducing the gas flow into the vessel and a discharge pipe for removing enriched gas flow from the vessel,
 the feed and discharge pipes each having a valve,
 the pipes ending in the vessel in such a manner that when the device is operative, the gas flows through the powder,
 the vessel (1) and the discharge pipe (19) being provided in a thermostatically controlled bath (2),
 the powder (13) including an additional solid inert component, the interior space (12) having two walls which are arranged transversely to the gas flow (4, 16) and are formed by gas-permeable, porous plates (10, 14), while the other walls of the interior space are impermeable to the gas flow.

Arrangements of this type, which will also afterwards be denoted as a powder evaporator, a powder saturator or a saturator, have for their object to adjust defined gas flows of low-volatile substances, which, for example, are used as starting compounds for reactive depositions from gas phases for example, CVD (chemical vapor deposition). Since commercially available energy flow control values normally require a differential pressure of approximately 300 hPa, they are only suitable for use with substances having vapour pressures of at least 300 hPa at temperatures below 90° C.

To increase the vapour pressure for low-volatile starting materials for CVD, metal-organic compounds (MOV) of the metal components to be deposited are generally used. Normally, the vapor deposition from the liquid phase of the metal-organic compounds or from a solution of the metal-organic compounds occurs at approximately atmospheric pressure. This results in the first place in low transfer rates and in the second place in a decrease versus time of the flow because of an increasing instability above the melting point and/or in the third place in a co-transfer of the solving agent. For that reason the invention relates inter alia to a powder evaporator for metal organic compounds operating at a low pressure, which solves the problems occurring in fluid evaporators for metal-organic compounds, which are operated at approximately normal pressure.

The problems occurring with low-volatile starting materials will now be described in detail by way of example, with thorium. There are no thorium compounds having vapour pressures of 300 hPa at room temerature. Thus, the thorium halides, for example, which would normally be suitable for CVD-methods do not reach vapour pressures of 10 hPa until at temperatures from 600° C. to 700° C. Certain metal-organic thorium compounds reach approximately 1 hPa at approximately 150° C., have below their melting point a still adequate stability, are anhydrous and can be used in the pulverulent form. Thorium heptafluordimetyl octadionate ($Th(fod)_4$), for example, has a vapour pressure of 0.13 hPa at 140° C, while thorium trifluoracetyl acetonate ($Th(tfa)_4$) has a vapour pressure of 1.3 hPa at that temperature. These compounds cannot be heated to a much higher temperature, as they then already start to decompose.

One of the most important conditions for the use of low-volatile pulverulent starting materials in the reactive deposition of layers from a gas phase at low pressures (LPCVD=low pressure CVD) is that an adequately high and constant energy flow of these materials must be obtained over prolonged coating periods, which are precisely the periods required for a low-volatile material. Almost all the known powder saturators and also fluid evaporators which no longer contain an adequately stable metal oxide compound show a comparatively significant drop in their efficiency and in the flow, although, as far as quantity is concerned, a very adequate quantity of material is available for evaporation and for transfer to the CVD reactor.

An arrangement of the type defined in the opening paragraph is disclosed in the DE-PS 1221520. In the interior of the evaporation vessel disclosed there is a sieve, on which, during operation, the pulverulent, low-volatile material is located in the form of a powder bed. A feed pipe leads from an inert gas storage container to the evaporation vessel, in which the feed pipe ends below the sieve. From the interior space of the evaporation vessel above the sieve a vapor discharge pipe leads to, for example, a reactor, in which vapour plating occurs, in which consequently a CVD-procedure is performed.

From DE-OS 3136895 another evaporator is known in which the feed and discharge pipes are each provided with a valve which is in the form of a non-return valve or a safety valve. From a formula mentioned therein it follows that the energy flow (designated vapour through-flow in said patent) is the higher the lower the overall pressure. In an approximation following therefrpom the overall pressure corresponds to the trigger value; the lowest differential trigger values being however located, for commercially available non-return valves, approximately 30 hPa, so that the overall pressure must not be less than 30 hPa. In addition, the approximation mentioned in the DE-OS 3136895 is not permissible, as the overall pressure corresponds to the sum of the trigger value and the reaction pressure, wherein reaction pressure must be understood to mean the pressure in the CVD reactor. However, also in LPCVD methods the reaction pressure is of the order of magnitude of some hectopascals.

SUMMARY OF THE INVENTION

A principal object of the invention is to provide an improved arrangement, in which during operation the gas flow is enriched up to the saturation point with the vapour of the low-volatile material, a higher energy flow of the low-volatile material is consequently obtained, a constant flow being obtained over a long period of time and thus typical phenomena which reduce the efficiency, such as chimney formation, contact sintering and obstructions, are prevented from occurring.

According to the invention, this object is accomplished by an arrangement of the type specified in the opening paragraphs in which, the cross-sectional area of the interior space of the vessel is at least a hundred times larger than the cross-sectional areas of the feed and discharge pipes, one of the two plates, the gas inlet plate, is arranged between the orifice of the feed pipe and the powder, the other plate, the gas outlet plate, is arranged between the powder and the orifice of the discharge pipe, at least one of the two plates is movable such, that, during operation, it is pressed onto the powder, the thickness of the gas inlet plate, the thickness of the gas outlet plate, the pore size of the two plates and the spacing between the two plates or the thickness of the powder bed, respectively, in the interior space are chosen such that, during operation, the pressure drop in the gas inlet plate exceeds the pressure drop in the powder bed, the pressure drop in the powder bed is much higher than the pressure drop in the gas outlet plate and the pressure drop in the gas outlet plate is much less than the pressure in the reactor.

During operation of the powder saturator of the invention the discharge pipe, that is to say the pipe connecting the saturator to the reactor, is heated to at least the saturation temperature, as otherwise during the transfer of vapour a partial condensation of the low-volatile materials occurs in the discharge pipe.

For the same reason, that is to say the partial condensation, the entire saturator inclusive of its exterior walls must be kept at the same temperature, namely the saturation temperature. Temperature differences of as low as 5° C. result for compounds such as Th(tfa)$_4$ or Th(fod)$_4$ or Sc(tfa)$_3$ in significant changes in the vapour pressure and consequently in recondensation.

The total vacuum-tight evaporation vessel is located, for example, in a thermostatically controlled liquid bath, which produces a uniform temperature, which depending on the material to be evaporated is between 30° and 300° C., also in the exterior regions, that is to say in the wall region of the powder bed parallel to the gas flow.

In the saturator according to the invention the total cross-section of the interior space is significantly increased relative to the cross-section of the feed and discharge pipes, which causes the flow rate in the interior space to be reduced.

As, has already been stated, low-volatile materials must be transferred with a sufficient flow force from the saturator to the reactor, the inert gas flows are as a rule approximately 100 times greater than the material flows. To achieve an adequate saturation, the high inert gas rates in the saturator must at least be reduced correspondingly. In accordance with the invention, this is accomplished by a significant increase of the cross-section of the interior space, put more accurately the overall pore-cross-sectional area of the saturator, in proportion to the cross-section of the remaining pipe system. As a lower limit for a variable saturation operation as regards setting range of the throughputs, it holds that the cross-sectional area is approximately 100 times larger than said pipes.

In the drawing

FIG. 1 is a schematical cross-sectional view of a powder saturator of the invention, FIG. 2 is a schematical cross-sectional view of a honey comb shaped interior space of the vessel of a powder saturator of the invention, FIG. 3 is a schematical longitudinal sectional view of a powder saturator of the invention in which the cross-sectional view of the interior space of the vessel increases towards the gas outlet, and FIG. 4 is a schematical sectional view of semi-spherical shaped powder saturator of the invention.

DETAILED DESCRIPTION OF THE INVENTION

Figure 1:
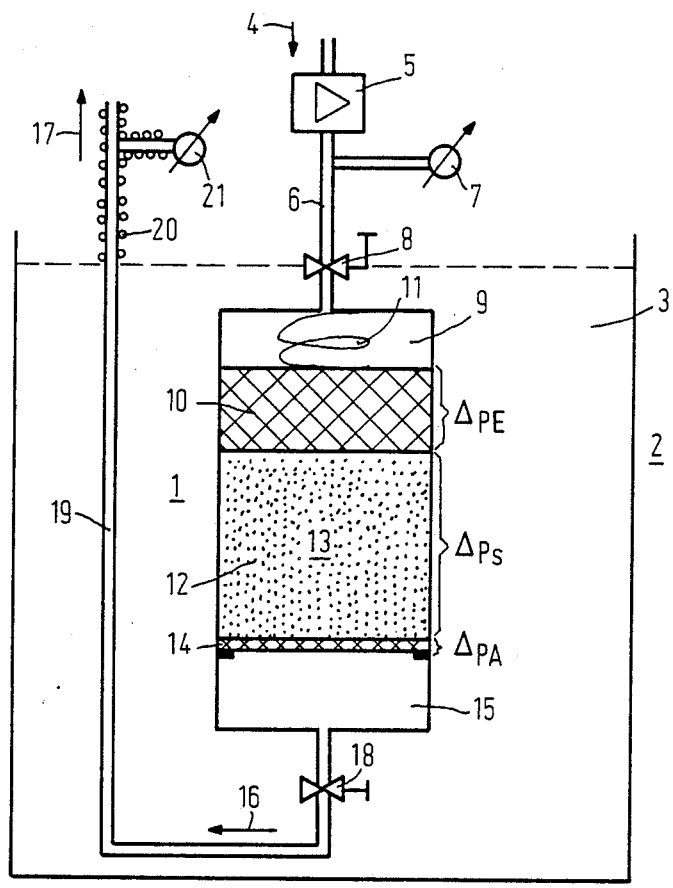

The increase of the cross-sectional area in the saturator according to the invention amounts therefore, for example, to at least 40 mm (diameter of the inner space) to 4 mm (diameter of the pipes)=10:1, that is to say 100:1 in the cross-sectional area. For large gas flows a ratio of 100:1 (diameter) or 10000:1 (areas), respectively, is advantageous.

The additional solid inert component, for example quartz powder, stabilizes the powder bed and provides that a very large surface of the low-volatile material is offered to the inert gas.

Thus, the interior space is filled with a porous mixture of pulverulent material, for example, quartz powder, which, because of its porosity of approximately 40%, partly compensates for the reduction in the flow rate, but whereby simultaneously a small transverse dimension in the individual flow channels is obtained. This results in a bundling or parallel arrangement, respectively, of very many very fine flow capillaries and at the same time a large surface area with low-volatile material.

In order to avoid a channel or chimney formation in the powder bed (mole tunnels), a uniform distribution of the gas flow through the cross-section of the interior space is adjusted over porous metal plates or glass frit provided one each at the carrier gas inlet and carrier gas outlet. Then the condition must be satisfied, that the pressure drop over the powder bed is so small as to be disregarded compared to the pressure drop over the porous metal plate.

The porous plate at the gas inlet is, for example, at least 10 to 20 mm thick and has, for example, a porosity of approximately 30%. This provides a uniform rate distribution of the inert gas over the overall cross-section of the interior space and the stabilized powder bed is utilized to an optimum extent.

The average pore size of the inlet plate and the outlet plate must be at least a factor of 2 to 3 less than the average particle size of the inertial component of the powder bed (for example quartz powder). The thickness of the gas inlet plate must then amount to 5 to 100 times the thickness of the outlet plate, preferably 20 to 30 times as large. In coating operations with reactor pressures of not more than 10 hPa the thickness of the gas outlet plate must not exceed 1 mm.

Pressing at least one of the porous plates onto the powder bed is effected, for example, by the gravitational force and/or the gas flow or by at least one spring, so that also during the progressive evaporation no cavities of a larger size occur.

The arrangement according to the invention is preferably suitable for operation at underpressure, the vessel being connected via the discharge pipe to a reactor chamber, for example for CVD, in which during operation of the arrangement a still lower pressure as in the vessel prevails.

The particle sizes of the inert component of the powder are preferably in the range from 20 to 100 $\mu$m, while the pore sizes of the two plates are preferably in the range from 10 to 30 μm and the particle sizes of the low-volatile, pulverulent material is preferably in the range from 0.1 to 20 μm.

The low-volatile, pulverulent material is preferably at least a metal-organic compound, which, during operation of the arrangement, is heated to a temperature near its melting point. Organic compounds of the alkali-earth metals or the transition metals, more specifically of elements of the scandium group and the rare earth, metals may be used as the metal-organic compounds.

Preferably, the feed pipe for the gas flow, the gas inlet plate, the gas outlet plate and the discharge pipe for the enriched gas flow are arranged such relative to each other that, the arrangement being in operation, the gas flows through the arrangement in the direction of the gravitational force.

In a further preferred embodiment of the invention an arrangement for stirring the powder bed is provided, so as to avoid chimney formation. This can be performed by, for example, a stirrer inserted into the powder when the powder is not compressed, by a worm gear or by an ultrasonic generator. The use of such an ultrasonic generator is a very elegant solution, as it does not require constructional changes. For coating operations whose duration is in the order of magnitude of one hour, mechanical stirring (poking) of the powder in the coating intervals provides a significant improvement.

Precisely with pulverulent materials which in the saturator are heated to just below their melting point (m.p.), for example $Th(tfa)_4$ (m.p. 134° C.), $Th(fod)_4$ (m.p. 151° C.) or $Sc(tfa)_3$ (m.p. 106° C.), a mechanical stirring or poking is advantageous. In these cases the powder to be evaporated in metered is mixed in metered quantites with dry quartz powder in a ratio 1:2, which is done with the object of stabilizing the powder bed. Nitrogen or argon are used as the inert gas. In the CVD reactor, which is arranged subsequent to the saturator, there is a pressure between 1 and 100 hPa, preferably 5 to 20 hPa, according to the purpose for which it is used. With carrier gas flows up to 500 sccm mass flows of the low-volatile materials of from 5 to 10 sccm can be obtained.

The pulverulent fill of the interior space is either stirred or poked during the operating intervals, or are stirred or kept in motion, for example mechanically or by means of an ultrasonic source during operation.

In a further preferred embodiment of the invention the stirring device is a device generating a magnetic field. In this case the inert component of the powder consists of magnetizable particles, for example magnetic iron balls, which are moved by an external magnetic field, or consist of magnetic iron filings, which are oriented and possibly moved in a magnetic field. Then, there are formed, flow capillaries having a cross dimension which advantageously influences the flow rate being generated in an inhomogeneous magnetic field.

The inert component of the powder has preferably a very small particle size distribution, the maximum fluctuation in the width of the particle diameter being less than 30% of the average particle diameter.

The inert component consists, for example, of small round balls, for example of quartz or high-grade steel, whose diameter is, for example, 0.5 mm.

In a further advantageous embodiment of the invention the pulverulent material is,—instead of being mixed with pulverulent inert material—inserted into the spacings between filaments (stretched in the transverse direction, stretched in the longitudinal direction or statistically interwoven) of inert material.

In a further embodiment according to the invention of the saturator, the interior space is formed by parallel separated conveyor channels, for example a member in the form of a honey comb, in which the powder to be evaporated is inserted, mixed with the inert powder component.

The efficiency of the saturator according to the invention can be influenced in that, because of the pressure drop over the powder bed, which in a first approximation is only linear, the flow rate at the inlet in the powder bed is much less than at the outlet in the thin porous plate. By an increase in accordance with the invention of the flow cross-section towards the gas outlet, this increase in the flow rate is optionally compensated for and a still further improved efficiency and flow being constant versus time is obtained. This increase in the cross-section is preferably achieved by increasing the cross-section of the interior space in the direction towards the gas outlet, or by giving the two porous plates and the interior space the shape of a semi-sphere.

FIG. 1 shows an evaporator vessel 1, which is arranged in a thermostat bath 2 containing a thermostat fluid 3.

An inert gas flow indicated by an arrow 4 enters an inlet chamber 9 via a mass flow control valve 5, a feed pipe 6 incorporating a manometer 7 and a close/open gas inlet valve 8, and flow with a pressure drop of $\Delta p_E$ through a thick porous gas inlet plate 10, which is pressed by means of a spring 11 onto a powder bed 13 which fills an interior space 12, which powder bed contains a low-volatile material to be evaporated and an inert component, so that substantially no cavities of a larger size are produced.

The porous plate 10 has for its object to provide a uniform inert gas rate distribution over the transverse dimension of the powder bed 13, so as to avoid the formation of chimneys. The inert gas flows through the powder bed 13 with a pressure drop $\Delta p_S$, whereafter the inert gas which in the mean time has been saturated with the low-volatile material, is discharged with a pressure drop $\Delta p_A$ through a thin porous gas outlet plate 14 into a gas outlet chamber 15. Thereafter, as is indicated by arrows 16 and 17, the gas flow arrives in a reaction chamber (not shown) via a close/open valve 18 and a discharge pipe 19 which is heated to at least the saturation temperature by a pipe heater 20 and a manometer 21. The manometer 21 has for its object to measure the pressure in the reaction chamber $p_{react}$.

The exterior wall of the vessel 1 is provided in the region of the interior space 12 with an ultrasonic generator (not shown), which during prolonged operation prevents the formation of chimneys, as it keeps the powder in slight motion. It may be advantageous to effect in the intervals between two coating operations an additional mechanical stirring and poking of the powder bed 13 in the interior space 12. This is of particular advantage when the saturator is operated, to obtain higher energy flows, just below the melting point of the material to be evaporated.

The average pore sizes of the inlet plate 10 and the outlet plate 14 are at least a factor of 2 to 3 smaller than the average particle size of the inert component of the powder bed 13 (for example quartz powder; inlet plate 10 and outlet plate 14 are frits with fine pores or porous sintered metal plates).

The thickness of the gas inlet plate 10 is, as has been stated, 5 to 100 times the thickness of the outlet plate 14, preferably 20 to 30 times. For coating operations with reactor pressures of not more than 10 hPa the thickness of 14 is not more than 1 mm.

For each of the pressure drops $\Delta p_E$, $\Delta p_S$, $\Delta p_A$ ($=\Delta_p$ of 10, 13, 14) the rule $\Delta p_E > \Delta p_S >> \Delta p_A$ and $\Delta p_A << P_{react}$ applies. This rule is efficiently satisfied when, for example, $\Delta p_E = 2$ $\Delta p_S = 200$ $\Delta p_A$ and $\Delta p_A = 0.1$ $p_{react}$. This pressure condition is identical to the previously specified geometrical requirement, as will be explained hereafter.

When the thicknesses are denoted by $d_E$, $d_S$ and $d_A$, then it must be noted that at equal porosity $d_E \gtrsim d_S >> d_A$. When the powder bed in the saturator is less dense it may be that $d_E < d_S$, provided the rule of the pressure drops applies. For an average pore size $\delta_A$ in the plate 14 and $\delta_E$ in the plate 10 of 20 μm and an average particle size $\delta_S$ of the quartz powder of 50 μm (50 μm ± 20 μm distribution) the thicknesses $d_E \approx d_S \geq 40$ $d_A$ or also already $d_E = 0.5$ $d_S \geq 20$ $d_A$, provides an effective saturator. The relation $$d_s/v_{Tr} > \delta_s/v_{d,B} \tag{1}$$

wherein $v_{Tr}$ denotes the flow rate of the inert gas and $V_{d,B}$ denotes the evaporation rate of a low-volatile material B, is a condition for the flow constant in time of the saturator. Since, as stated in the foregoing, low-volatile material must be transferred from the saturator with a still adequate flow into the reactor, the inert gas flows are as a rule approximately 100 times greater than the flows of material. To obtain an adequate saturation, the high inert gas rates in the saturator must be at least correspondingly reduced. As stated above, this is obtained by a significant increase in the pipe cross-section, put more accurately the overall pore-cross-sectional areas of the saturator $F_{S,eff}$, in proportion to the cross-section $F_{pipe}$ of the further portion of the pipe system. $F_{S,eff}$ is $F_S \cdot \eta p$, wherein $\eta p$ denotes the porosity of the powder bed. $F_{S,eff} >> 100$ $F_{pipe}$ holds as the lower limit for a variable saturator operation relative to the setting range of the throughputs, $p_{react}$ being approximately in the range of 10 hPa.

In general the condition $$F_{S,eff}/F_{pipe} \geq p_o/p_{react} \tag{2}$$

must be satisfied, wherein $p_{react} < p_o = 1000$ hPa.

As a rule it is sufficient to use the rule of thumb $F_S/F_{pipe} \approx p_o/p_{react}$.

Now however a still further boundary condition for the geometrical dimensions of the saturator must be satisfied. Short cross-diffusion paths must be present, that is to say the time for the cross-diffusion of the instantaneous evaporizing surface in a flow capillary must be shorter than the overall through-flow time through the interior space through these flow capillaries. Only then an adequate saturation can be obtained. It is then a requirement for the evaporation rate from the surface to be higher than the diffusion rate, as otherwise the formula (1) would be valid. The further condition according to the invention is $$\delta_S^2/4D \leq d_s/v_{Tr} \tag{3}$$

wherein D is the diffusion constant.

As a check in a concrete example the typical values of the individual values for the stator will now be determined. From the formula $$v_{d,B} = f \cdot \sqrt{R_o T/2\pi M} \tag{4}$$

wherein f denotes the evaporation coefficient, $R_o = 62.364 \cdot 10^3 \cdot 1.33$ hPa·cm³/K, i.e. the gas constant, T the temperature of the material B and M the molecular weight of the material B. With T = 400 K, M = 1412 for B = Th(fod)₄ and f = 1 one obtains an evaporation rate $v_{d,B} \approx 2000$ cm/s. For the path $\bar{x}$ which is covered on an average in the time t during the subsequent diffusion movement it holds also for the transverse component that $$\bar{x} = \sqrt{Dt} \tag{5}$$

In accordance with an approximation formula published by F. Welding in ISPC 7, Eindhoven 1985, pp. 165 to 170, it is possible to calculate the diffusion constants as $D_1 = 0.43$ cm²/s, $D_2 = 0.5$ cm²/s and $D_3 = 0.85$ cm²/s when $T_S = 400$ K and $p_S = 50$ hPa for $B_1 = Th(fod)_4$, $B_2 = Th(tfa)_4$ and $B_3 = Sc(tfa)_3$. In operation, the diffusion constants in the saturator are therefore between 0.2 and 1 cm²/s for $p \approx 50$ hPa and between 1 and 5 cm²/s for $p_S \approx 10$ hPa. Hence, $D \approx 1$ cm²/s was the starting point. The diffusion rate $v_{diff} = \bar{x}/t = D/t$ is consequently of the order of magnitude of 1 cm/s and is consequently clearly less than the evaporation rate, so that $v_{diff}$ is the limiting value. Not until from $f < 10^{-3}$, $v_{d,B}$ gradually takes over the role as the limiting factor.

If the inert powder component has, for example, a particle size distribution $\delta_{S,min} \leq \delta_S \leq \delta_{S,max}$, then as a rule the smaller dimensions are decisive. If an average inert particle size of 50 μm is inserted in $\delta_S^2/4D$, then an order of magnitude of approximately $3 \cdot 10^{-5}$ s is obtained for a duration of the transverse movement. For $Q_{Tr} = 500$ sccm, $p_S = 10$ hPa, $\eta_p = 0.3$ and $F_s = 4$ $\pi$cm², it now follows that $v_{Tr} = v_{Ar} \approx 300$ cm/s and consequently $d_S/v_{Ar} \approx 10^{-2}$ s, so that condition (3) is appropriately satisfied. Also the general constructional rule according to the invention for low-pressure evaporators having metal-organic compounds $$\delta S^2 \leq d_S/100 \tag{6}$$

wherein $\delta_S$ and $d_S$ in cm is then satisfied to an appropriate extent.

Figure 2:
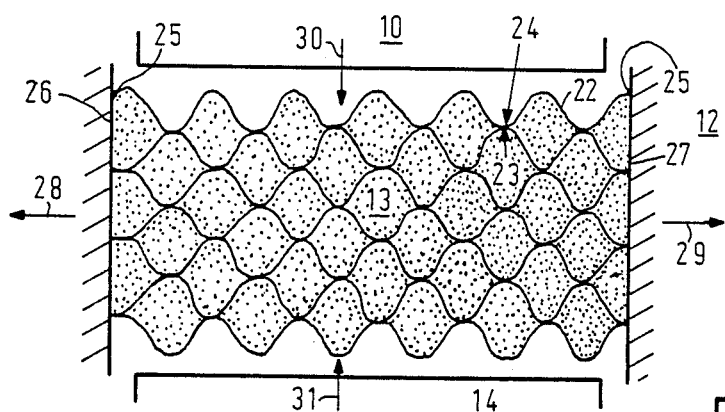

FIG. 2 shows an interior space 12 formed by parallel, separated conveyor channels, made of corrugated honey comb construction, in which the powder to be evaporated, mixed with an inert powder component.

For the manufacture of the channels of corrugated honeycomb construction, sinusoidally shaped corrugated sheets 22 of an inert material, with which the material to be evaporated does not react (for many uses high-quality steel corrugated sheets, tantalum or molybdenum sheets can, for example, be used), are shifted through 90° and welded together through the "maximums" 23 and "minimums" 24, so that a linear honey comb structure is obtained.

The exterior sides 25 of these sheets are each rigidly welded or clamped and bolted, respectively on both sides in a fixed wall 26, 27. Perpendicularly to the plane of intersection there are provided above and under this lamination a fitting, tightly covering and removable thick porous plate 10 at the gas inlet and a corresponding thinner plate 14 at the gas outlet. The powder bed 13 in the interior of the individual lamellae is kept dense by drawing apart the walls 26 and 27 (arrows 28 and 29) and/or by pressure or pressing, respectively, of the plates 10 and 14 (arrows 30 and 31) and the formation of chimneys or mole tunnels, respectively, in the powder bed is prevented. The pulverulent low-volatile material 10 is poured in from above after removal, for example, of the porous gas inlet plate 10. The operating position of the interior space after closing of the vessel is at one's option, it may be in a perpendicular but alternatively also horizontal position. The great advantage of such a saturator is that the formation of wide chimneys is prevented and yet the flow resistance is low. An advantageous variant is to direct a portion of the lamellae in one direction and the other portion in the opposite direction, with a correspondingly tight separation at thee lamellae inlet and lamellae outlet (in accordance with the cascade circuit principle).

Figure 3:
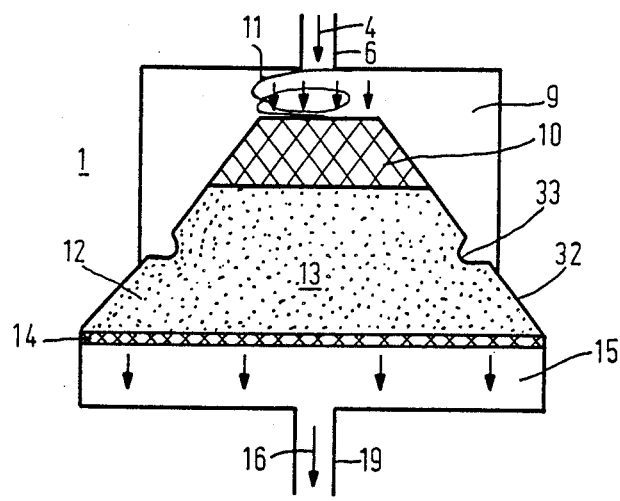

Before FIG. 3 is described, it should be noted that the efficiency of a saturator can also be influenced by the fact that because of the pressure drop $\Delta p_S$ over the powder bed, which in a first approximation is only linear, the flow rate at the inlet at the pressure $p_{react} + \Delta p_A + \Delta p_S$ is much less than at the outlet in the thin porous plate with the pressure $\Delta p_A + p_{react}$ at the boundary plane. By increasing in accordance with the invention the cross-section of the saturator up to the gas inlet, this increase in the flow rate can be compensated and a still better efficiency and flow constant versus time is obtained. FIG. 3 shows such a saturator, in which the reference numerals have the same meaning as in FIG. 1.

In addition to the increase in the cross-section towards the gas outlet, the impermeable wall 32 of the vessel 1, which is, for example, made of flexible sheet metal, is provided in at least one position with an annular corrugated bellow compensation zone, so that under pressure of the spring 11 the powder bed 13 a dense posed from above, that is to say without the formation of larger cavities.

Figure 4:
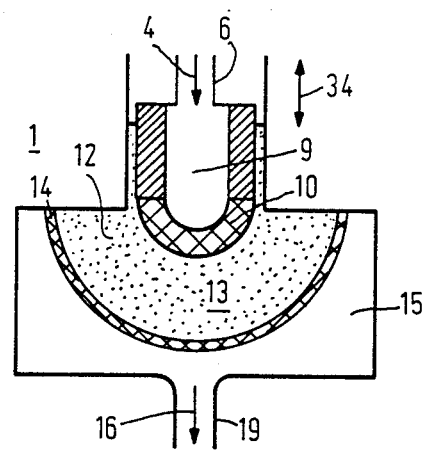

FIG. 4 in which the reference numerals have the same meaning as in FIG. 1 and FIG. 3 shows a saturator of a semi-spherical structure.

Pressing the powder bed is achieved by a sort of ram having a gas inlet chamber 9 and a semi-spherical porous gas inlet plate 10, which is pressed from above onto a powder bed 13, which is indicated by double arrows 34. The saturated inert gas flows through a thin porous outlet semi-spherical cap 14 into a gas outlet chamber 15 and from there flows on to a reactor. Such an arrangement has the advantage that the flow rate in individual capillaries because of the integral cross-section increase remains approximately constant and the transverse diffusion at the outlet is higher, which means a lower effective pressure $p_{S,eff}$ in the saturator and consequently a higher energy flow.

We claim:

1. A heatable arrangement for producing a gas flow which is
   enriched with the vapour of a low-volatile, pulverulent substance, and which gas flow comprises an inert gas, the arrangement comprising:
   a vessel having an interior space (12) for holding a powder bed
   a powder bed (13) comprising said low-volatile pulverulent substance positioned in said interior space
   a feed pipe (6) for the gas flow and
   a discharge pipe (19) for discharging the enriched gas flow into a reactor,
   the feed and discharge pipes each having a valve and
   the pipes ending in the vessel in such a manner that when the arrangement is operative, the gas flows through the powder bed,
   the vessel (1) and the discharge pipe (19) being provided in a thermostatically controlled bath (2),
   the powder bed (13) including at least one additional solid inert component,
   the interior space (12) having two walls which are arranged transversely of the gas flow (4, 16) and are formed by a gas inlet plate (10) and a gas outlet plate (14) both of said plates (10, 14) being gas permeable porous plates the outer walls of the interior space being impermeable to gas,
   characterized in that,
   the cross-sectional area of the interior space (12) is at least a hundred times larger than the cross-sectional area of the feed and discharge pipes (6, 19),
   the gas inlet plate (10), is arranged between the orifice of the feed pipe (6) and the powder bed (13),
   the gas outlet plate (14) is arranged between the powder bed (13) and the orifice of the discharge pipe (19),
   at least one of the two plates is movable in a manner such that, the arrangement being operative, it is pressed into the powder bed (13),
   the thickness of the gas inlet plate (10), the thickness of the gas outlet plate (14), the pore size of the two plates (10, 14) and the spacing between the two plates (10, 14) or the thickness of the powder bed (13), respectively, in the interior space (12) are chosen such that, the arrangement being operative, the pressure drop in the gas inlet plate (10) exceeds the pressure drop in the powder bed (13), the pressure drop in the powder bed (13) is much higher than the pressure drop in the gas outlet plate (14), and the pressure drop in the gas outlet plate (14) is much less than the pressure in the reactor.

2. An arrangement as claimed in claim 1, characterized in that it can be operated at sub-atmosphere pressure, the vessel (1) being connected via the discharge pipe (19) to a reaction chamber in which, the arrangement being operative, a still lower pressure than in the vessel (1) prevails.

3. An arrangement as claimed in claim 1, characterized in that the particle sizes of the inert components of the powder bed (13) are in the range from 20 to 100 $\mu m$, the pore sizes of the two plates (10, 14) are in the range from 10 to 30 $\mu m$ and the particle sizes of the low-volatile, pulverulent material are in the range from 0.1 to 20 $\mu m$.

4. An arrangement as claimed in claim 1, characterized in that the low-volatile, pulverulent substance is a metal-organic compound which, the arrangement being operative, is heated to a temperature near its melting point.

5. An arrangement as claimed in claim 4, characterized in that the low-volatile, pulverulent substance is an organic compound of the alkali-earth metals or the transition metals.

6. An arrangement as claimed in claim 5, characterized in that the low-volatile, pulverulent substance is a metal-organic compound containing elements of the scandium group or of the rare earth metals.

7. An arrangement as claimed in claim 1, characterized in that the feed pipe (6) for the gas flow, the gas inlet plate (10), the gas outlet plate (14) and the discharge pipe (19) for the enriched gas flow are so arranged relative to each other that, the arrangement being operative, the gas flow (4, 16) flows in the direction of the gravitational force through the arrangement.

8. An arrangement as claimed in claim 1, characterized in that the thickness of the gas-inlet plate (10) is 20 to 30 times the thickness of the gas outlet plate (14) and either the spacing between the two plates (10, 14) or the thickness of the powder bed (13), respectively, in the inerior space (12) is not more than twice the thickness of the gas inlet plate (10).

9. An arrangement as claimed in claim 1, characterized by a device for stirring the powder bed (13).

10. An arrangement as claimed in claim 9, characterized in that the stirrer device is a device generating a magnetic field and the inert component of the powder bed (13) consists of magnetizable particles.

11. An arrangement as claimed in claim 1, characterized in that the inert component of the powder bed (13) has a small particle size distribution, the maximum fluctuation of the particle diameter being less than 30% of the average particle diameter.

12. An arrangement as claimed in claim 1, characterized in that the inert component of the powder bed (13) is formed by filaments of an inert material, which are are stretched in the interior space (12).

13. An arrangement as claimed in claim 1, characterized in that the interior space (12) consists of parallel separate conveyor channels.

14. An arrangement as claimed in claim 1, characterized in that the gas flow has a cross-section that widens towards the discharge side.

15. An arrangement as claimed in claim 14, characterized in that the cross-section of the interior space (12) is widened towards the gas outlet (15).

16. An arrangement as claimed in claim 14, characterized in that the two porous plates (10, 14) and the interior space (12) are of a semi-spherical shape.

* * * * *